United States Patent [19]

Swanson

[11] Patent Number: 5,360,990
[45] Date of Patent: Nov. 1, 1994

[54] P/N JUNCTION DEVICE HAVING POROUS EMITTER

[75] Inventor: Richard M. Swanson, Los Altos, Calif.

[73] Assignee: Sunpower Corporation, Sunnyvale, Calif.

[21] Appl. No.: 38,401

[22] Filed: Mar. 29, 1993

[51] Int. Cl.$^5$ .............................................. H01L 29/12
[52] U.S. Cl. ..................................... 257/656; 257/130
[58] Field of Search ............... 257/104, 106, 109, 130, 257/131, 145, 655, 656, 657, 107

[56] References Cited

U.S. PATENT DOCUMENTS 4,587,547  5/1986  Amemiya et al. .................. 257/655
5,063,428  11/1991  Schlangenotto .................... 257/656

OTHER PUBLICATIONS

Arnould, "Dispositifs De Puissance Dipolaires Rapid A Porteurs De Duree De Vie Tres Elevee," Journees Electronique De Puissance De Futur, Bordeaux, Jun. 1-3, 1988.

Schlangenotto, "Improved Recovery of Fast Power Diodes with Self-Adjusting p Emitter Efficiency," IEEE Electron Device Letters, vol. 10, No. 7, Jul. 1989, pp. 322-324.

Shimizu, "High-Speed Low-Loss p-n Diode Having a Channel Structure," IEEE Transactions on Electron Devices, vol. ED-31, No. 9, Sep. 1984, pp. 1314-1319.

Mehrotra, "Comparison of High Voltage Power Rectifier Structures," 5th International Symposium on Power Semiconductor Devices and IC's, 0-7803-13-13-5/93/0000-0199/$3.00 © 1993 IEEE, pp. 199-204.

*Primary Examiner*—Andrew J. James
*Assistant Examiner*—Nathan K. Kelley
*Attorney, Agent, or Firm*—Townsend and Townsend Khourie and Crew

[57] ABSTRACT

In a semiconductor P/N junction device, a porous emitter is provided which has high saturation current to limit injected charge when the device is conducting. The porous emitter includes a lightly doped region abutting a contact on the surface of the device to regulate minority carrier injection under forward bias and shield the contact from stand-off field when the device is not conducting. One or more heavily doped regions are provided in the first region to provide low contact resistance for the flow of majority carriers into the emitter.

3 Claims, 2 Drawing Sheets

P/N JUNCTION DEVICE HAVING POROUS EMITTER

BACKGROUND OF THE INVENTION

This invention relates generally to P/N junction devices such as semiconductor diodes and thyristors, and more particularly the invention relates to such junction devices having improved turn off characteristics.

In forward biased P/N junction semiconductor devices such as PIN diodes and PNIPN thyristors, a large amount of charge can be stored in the highly injected intrinsic standoff region during conduction (on state) of the device. The stored charge must be removed during turn off of the device. This can be accomplished either through carrier recombination or by transport of the carriers to the anode and cathode contacts. The conventional method of achieving fast turn off is to create mini defects in the semiconductor body which act as recombination centers. This is usually done either by diffusing gold into the device or by creating crystal defects by electron irradiation. Both of these techniques have draw backs; gold diffusion can create precipitates which reduce breakdown, and electron irradiation crystal damage can be annealed out which limits permissible die attach and soldering temperature.

Speed enhancement for lifetime reduction is limited by more fundamental issues, however. In order to maintain sufficient conductivity modulation, it is necessary that the ambipolar diffusion length, $L_a$, be longer than half the stand off region thickness, W. This requires that:

$$L_a = \sqrt{D_a \tau_{h1}} > W/2,$$

$$\tau_{h1} > W^2/4D_a,$$

where $\tau_{h1}$ is the high-level lifetime and $D_a$ is the ambipolar diffusion constant. This gives $\tau_{h1} \approx 1 \ \mu S$ when $W = 100 \ \mu m$. The switching time will be roughly equal to this. As the lifetime is decreased from this value, the on-voltage will increase rapidly in an exponential manner.

Because of the exponential dependence of carrier density on distance when recombination is present, charge control by lifetime reduction results in excess charge at the ends of the stand-off region while starving the center. The voltage drop across the stand-off region is either quite small (less than 0.2 V or so) or very large as the diffusion length becomes too short. The result is that more charge is stored than is really needed.

SUMMARY OF THE INVENTION

In accordance with the present invention, saturation currents are increased and stored charge reduced in a forward biased semiconductor P/N junction device by providing a porous emitter (e.g., anode, cathode). More particularly, each carrier emitter in the device comprises a lightly doped region with one or more highly doped regions therein of the same conductivity type and extending to a surface and to an overlying conductive contact. The more highly doped region or regions reduces contact resistance while the more lightly doped region controls injected charge.

In accordance with a feature of the invention, electron and hole carrier density is constant through the P/N junction device by adjusting the ratio of electron and hole currents to be equal to their mobilities, or $$J_n = (\mu_n/\mu_p)J_p$$

This results in minimum voltage drop for a given stored charge.

The invention and objects and features thereof will be more readily apparent from the following detailed description and appended claims when taken with the drawing.

DETAILED DESCRIPTION OF ILLUSTRATIVE EMBODIMENTS

Figure 1:
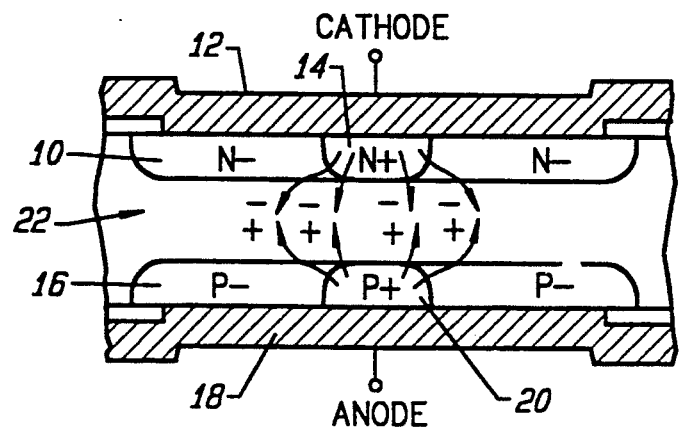
FIG. 1 is a section view of a PIN diode in accordance with one embodiment of the invention.
Figure 2:
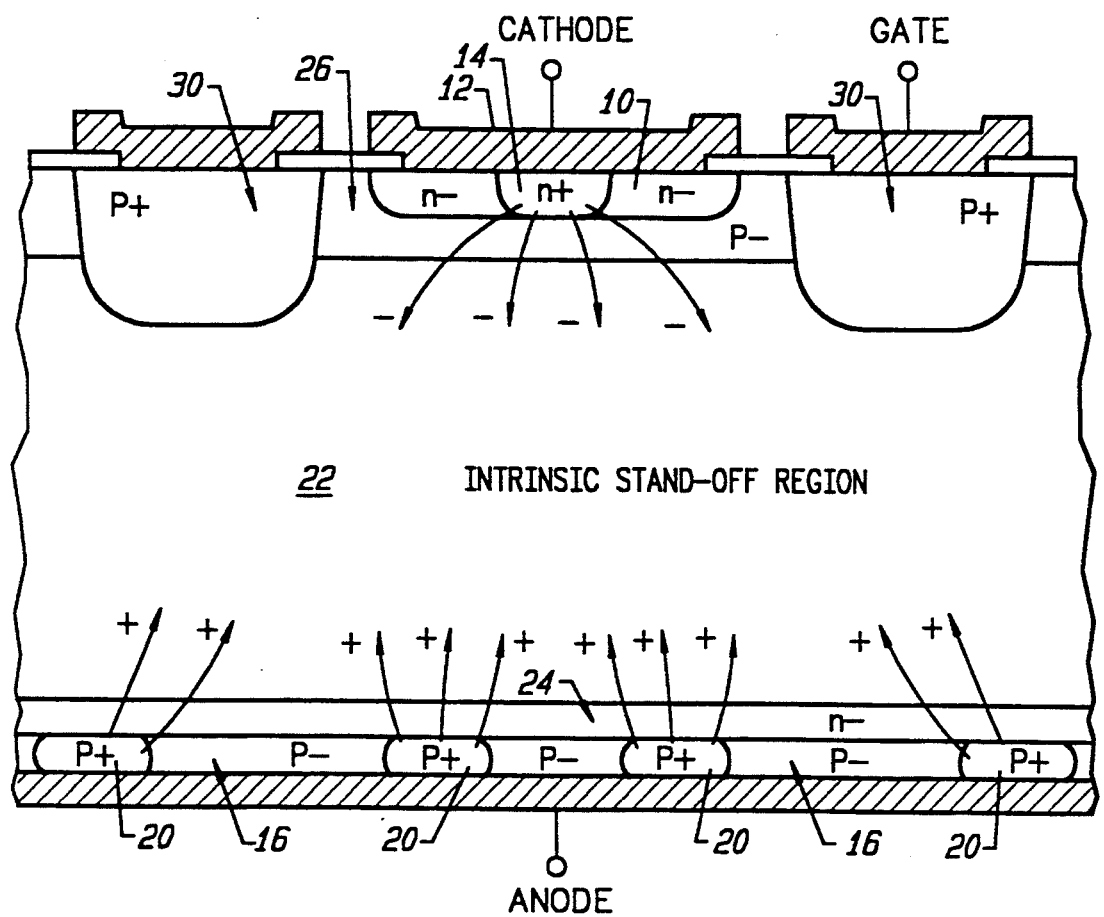
FIG. 2 is a section view of a thyristor in accordance with another embodiment of the invention.

Referring now to the drawing, FIG. 1 is a section view of a PIN diode in accordance with one embodiment of the invention and FIG. 2 is a section view of a voltage controlled thyristor in accordance with another embodiment of the invention. The cathode of the PIN diode in FIG. 1 includes an N- region 10 which abuts a surface of the semiconductor body and the cathode contact 12. Within region 10 is at least one N+ region 14 which extends to the surface and to contact 12. Similarly, the anode includes a P- region 16 which extends to an opposing surface of the semiconductor body and to anode contact 18. At least one P+ region 20 is provided in region 16 and extends to the surface and contact 18. Between the N-region 10 and P- region 16 is an intrinsic semiconductor region 22 in which charge builds up during the on state of the PIN device during which electrons are emitted from the cathode toward the anode, and holes are emitted from the anode toward the cathode, as indicated by the minus signs (electrons) and plus signs (holes) in the drawing.

The voltage controlled thyristor of FIG. 2 has similar cathode and anode regions, and like reference numerals are used in FIG. 2. In addition, the thyristor has an N-layer 24 abutting the P- layer 16, and a P- layer 26 abutting the N- layer 10 of the cathode. An annular P+ region 30 surrounds the cathode and functions as the gate for the thyristor.

If the carrier lifetimes are high, the carrier density varies linearly from anode to cathode. In fact, if the ratio of electron current, $J_n$, and hole current, $J_p$, is adjusted to be equal to their mobilities, i.e., when $J_n = (\mu_n/\mu_p)J_p$, the carrier density will be constant from front to back. This results in minimum voltage drop for a given stored charge. For typical device parameters, the stored charge would be very high and the voltage drop very small (less than several mV). By having emitters with high saturation current, however, it is possible to limit this charge to any desired value.

To quantify the advantages of the invention, assume that we have a PIN diode and that the voltage drop across the intrinsic stand-off region is $V_B$. It can be shown that $$V_B = \frac{JW}{q(\mu_n + \mu_p)n}$$

where n is the injected electron and hole density in the stand-off region (assumed constant as discussed above), $\mu_n$ is the electron mobility, $\mu_p$ is the hole mobility, and J is the current density. The charge storage time is $\tau_{stor} = Q/J = qnW/J$. Using the above relation for $V_B$, one obtains $$\tau_{stor} = \frac{W^2}{(\mu_n + \mu_p)V_B}.$$

If one has W=100 μm once again and allows for 0.3 V standoff region voltage drop (giving a total diode drop of around 1 V) then $\tau_{stor}=0.2$ μs—a five fold improvement over the above prior art case using lifetime reduction.

To obtain such low stored charge requires rather special cathode and anode diffusions. For example, to obtain the above switching condition when J=200 A/cm$^2$, requires that n=J$\tau_{stor}$/qW or n=2.5×10$^{16}$ cm$^{-3}$. It can be shown that $J = (J_{on}+J_{op})(n^2/n_i^2)$ where $J_{on}$ and $J_{op}$ are the saturation currents of the cathode and anode. This gives $J_{on}+J_{op}=7\times 10^{-11}$ A/cm$^2$. Typical diffusions might have $J_o 1 \times 10^{-12}$ A/cm$^2$, a factor of 70 less. This results in $\sqrt{70} \approx 8$ times more stored charge.

Figure 3:
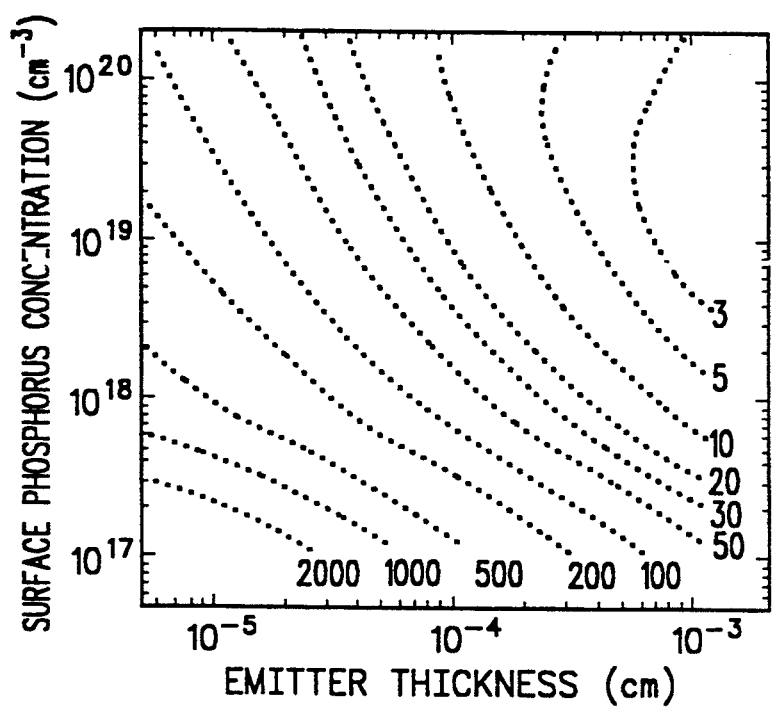
FIG. 3 is a graph illustrating contours of constant $J_o$ as a function of surface concentration of phosphorus and emitter thickness.
Figure 4:
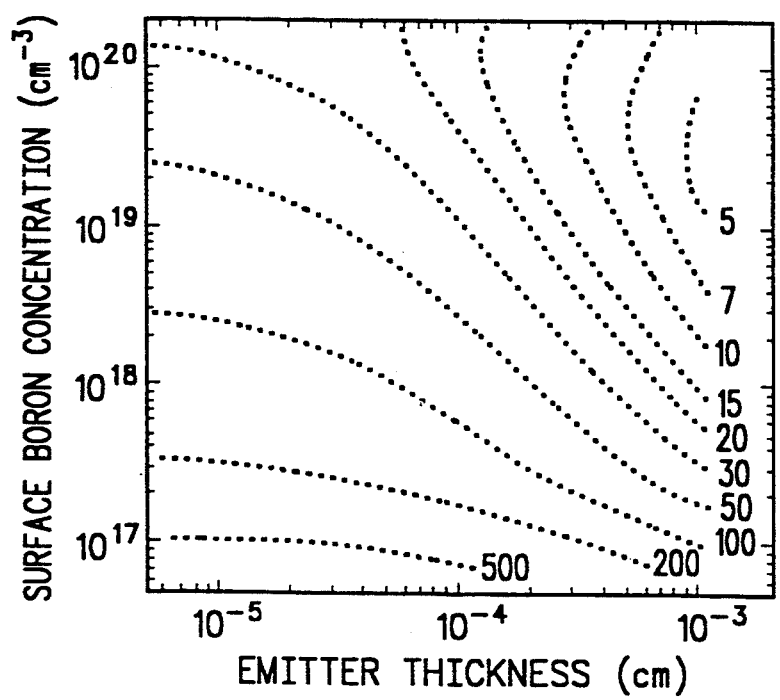
FIG. 4 is a graph illustrating contours of $J_o$ as a function of surface concentration of boron and emitter thickness.

FIGS. 3 and 4 show the saturation currents for n-type and p-type emitters contacted with aluminum for a variety of diffusion depths and surface concentrations. To have $J_n = (\mu_n/\mu_p)J_p$ in a diode (i.e., constant carrier density) it can be shown that one must have $J_{op}=(\mu_n/\mu_p)J_{on}$. This means that $$J_{op} = \frac{\mu_n/\mu_p}{1 + \mu_n/\mu_p} (J_{on} + J_{op}).$$

and $$J_{on} = \frac{1}{1 + \mu_n/\mu_p} (J_{on} + J_{op}).$$

For the above case where $J_{on}+J_{op}=7\times 10^{-11}$ A/cm$^2$, we have $J_{op}=5.25\times 10^{-11}$ A/cm$^2$ and $J_{on}=1.75\times 10^{-11}$.

Referring to FIGS. 3 and 4 we see that the diffusions must have very low surface concentration; around $1\times 10^{17}$ cm$^{-3}$ for the p-diffusion and $1\times 10^{18}$ cm$^{-3}$ for the n-diffusion. Such diffusions would have very high contact resistance. Therefore, we use the two-level diffusion; a lightly doped region to control injected charge and a heavily doped region (e.g., $10^{19}$ cm$^{-3}$ or more) to provide low contact resistance, as shown in FIGS. 1 and 2.

There has been described P/N junction devices having porous emitters to achieve a constant carrier density and reduced stored charge when the device is conducting. The porous emitter of the device permits reduced contact resistance and high saturation current. While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A semiconductor device comprising
   a semiconductor body comprising monocrystalline silicon having first and second mayor opposing surfaces,
   a first region in said semiconductor body abutting said first major surface and having phosphorous dopant therein of a first conductivity type and of a first concentration of approximately $1\times 10^{18}$ atoms cm$^{-3}$,
   a second region in said first region, said second region abutting said first major surface and having phosphorous dopant therein of said first conductivity type and of a second concentration greater than said first concentration,
   a contact on said first major surface and abutting said first region and said second region, said second region providing low contact resistance and said first region regulating minority carrier injection when forward biased and shielding said first contact from any stand-off field when said device is not conducting,
   a third region in said semiconductor body abutting said second major surface and having boron dopant therein of a second conductivity type and of a third concentration of approximately $1\times 10^{17}$ atoms cm$^{-3}$,
   a fourth region in said third region, said fourth region abutting said second major surface and having boron dopant therein of said second conductivity type and of a fourth concentration type greater than said third concentration, and
   a second contact on said second major surface and abutting said third region and said fourth region, said fourth region providing low contact resistance and said third region regulating minority carrier injection when forward bias and shielding said second contact from any stand-off field when said device is not conducting.

2. The semiconductor device as defined by claim 1 wherein said first contact and said second contact comprise aluminum.

3. The semiconductor device as defined by claim 2 wherein said semiconductor body further includes an intrinsic region between said first region and said third region.

* * * * *